US012782484B2

(12) United States Patent
Zhang

(10) Patent No.: US 12,782,484 B2
(45) Date of Patent: Nov. 3, 2026

(54) FLIP ANGLE DETERMINATION FOR MULTI-TISSUE MAGNETIC RESONANCE SCANNING

(71) Applicant: Siemens Healthcare GmbH, Erlangen (DE)

(72) Inventor: Qiong Zhang, Shenzhen (CN)

(73) Assignee: Siemens Healthineers AG, Forchheim (DE)

( * ) Notice: Subject to any disclaimer, the term of this patent is extended or adjusted under 35 U.S.C. 154(b) by 221 days.

(21) Appl. No.: 18/519,136

(22) Filed: Nov. 27, 2023

(65) Prior Publication Data

US 2024/0175953 A1 May 30, 2024

(30) Foreign Application Priority Data

Nov. 30, 2022 (CN) ........................ 202211519117.1

(51) Int. Cl.
*G01R 33/561* (2006.01)
*G01R 33/54* (2006.01)
*G01R 33/58* (2006.01)
*G01R 33/485* (2006.01)

(52) U.S. Cl.
CPC ....... *G01R 33/5613* (2013.01); *G01R 33/543* (2013.01); *G01R 33/586* (2013.01); *G01R 33/485* (2013.01)

(58) Field of Classification Search
CPC . G01R 33/543; G01R 33/5613; G01R 33/586
See application file for complete search history.

(56) References Cited

U.S. PATENT DOCUMENTS

| | | | | | |
|---|---|---|---|---|---|
| 5,417,213 | A * | 5/1995 | Prince | A61B 5/411 600/419 |
| 2005/0256393 | A1* | 11/2005 | Deoni | G01R 33/50 600/407 |
| 2015/0071514 | A1* | 3/2015 | Wang | G01R 33/5659 382/131 |
| 2019/0033418 | A1* | 1/2019 | Haacke | A61B 5/055 |
| 2019/0310340 | A1* | 10/2019 | Fautz | G01R 33/4828 |

OTHER PUBLICATIONS

Mag Res in Med—2006—Yamykh—Actual flip angle imaging in the pulsed steady state (Year: 2006).*

* cited by examiner

*Primary Examiner* — Steven L Yeninas
(74) *Attorney, Agent, or Firm* — Banner & Witcoff, Ltd.

(57) ABSTRACT

Method and apparatus for determining a flip angle for multi-tissue magnetic resonance scanning. The method including: determining multiple types of tissue of interest for MRI this time; acquiring a relationship between combined SSI MR signal strength of all the tissues of interest and flip angle of an SSI sequence; acquiring a maximum value of the combined SSI MR signal strength of all the tissues of interest; according to the maximum value of the combined SSI MR signal strength of all the tissues of interest, acquiring an optimum flip angle which causes the combined SSI MR signal strength of all the tissues of interest and contrast between the tissues of interest simultaneously to be optimal; and taking the optimum flip angle to act as a flip angle of an SSI sequence for multi-tissue MR scanning this time.

11 Claims, 7 Drawing Sheets

FLIP ANGLE DETERMINATION FOR MULTI-TISSUE MAGNETIC RESONANCE SCANNING

TECHNICAL FIELD

The present disclosure relates to the technical field of MRI (magnetic resonance imaging) and, in particular, to a method and apparatus for determining a flip angle in multi-tissue MR (magnetic resonance) scanning and an MRI system.

BACKGROUND

Pulse sequences of MRI may be generally divided into two main types: spin echo and gradient echo. Spin echo generates an echo by means of applying a 180-degree radio-frequency pulse, whereas gradient echo generates an echo by means of a reverse gradient. In the design of a gradient echo sequence, it is required that signals are collected when a transverse magnetization vector reaches a steady equilibrium state. According to a mechanism for forming a magnetization vector steady state, a gradient echo may be divided into two main types: an SSC (steady state coherent) sequence and an SSI (steady state incoherent) sequence. A gradient pulse in an SSI sequence eliminates or spoils any residual transverse magnetization before each new radio-frequency pulse appears.

In multi-tissue magnetic resonance imaging, in order to improve signal strength of tissues of interest and contrast between the tissues of interest, at present, a user manually modifies parameters related to an SSI sequence. The defects of such a method are: manually modifying parameters is less efficient, and generally cannot achieve the optimum signal strength of tissues of interest and optimum contrast between the tissues of interest.

SUMMARY

In view of this, one aspect of aspects of the present disclosure proposes a method and apparatus for determining a flip angle for multi-tissue MR scanning to acquire a flip angle that enables signal strength of tissues of interest and contrast between the tissues of interest to be optimal, before multi-tissue magnetic resonance imaging; another aspect proposes an MRI system, to acquire a flip angle which enables signal strength of tissues of interest and contrast between the tissues of interest to be optimal, before multi-tissue magnetic resonance imaging.

A method for determining a flip angle for multi-tissue magnetic resonance scanning, the method comprising:

determining multiple types of tissue of interest for MRI (magnetic resonance imaging) this time;

acquiring a relationship between combined SSI (steady state incoherent) MR (magnetic resonance) signal strength of all the tissues of interest and flip angle of an SSI sequence for MRI this time;

according to the relationship between combined SSI MR signal strength of all the tissues of interest and flip angle of the SSI sequence for MRI this time, acquiring a maximum value of the combined SSI MR signal strength of all the tissues of interest;

according to the maximum value of the combined SSI MR signal strength of all the tissues of interest, acquiring an optimum flip angle which causes the combined SSI MR signal strength of all the tissues of interest and contrast between the tissues of interest simultaneously to be optimal; and taking the optimum flip angle as a flip angle of an SSI sequence for multi-tissue MR scanning this time.

The step of acquiring a relationship between combined SSI MR signal strength of all the tissues of interest and flip angle of the SSI sequence for MRI this time comprises:

according to longitudinal relaxation time T1, enhanced transverse relaxation time T2*, magnetization strength in a state of thermal equilibrium and spin density of each type of tissue of interest for MRI this time, and repetition time TR and echo time TE of an SSI sequence for MRI this time, calculating a relationship between combined SSI MR signal strength of all the tissues of interest and flip angle of the SSI sequence.

The step of acquiring an optimum flip angle which causes the combined SSI MR signal strength of all the tissues of interest and contrast between the tissues of interest simultaneously to be optimal, according to the maximum value of the combined SSI MR signal strength of all the tissues of interest, comprises:

subtracting a maximum tolerance value from the maximum value of the combined SSI MR signal strength of all the tissues of interest, to obtain a final value of combined SSI MR signal strength of all the tissues of interest; and taking a larger flip angle corresponding to the final value of combined SSI MR signal strength of all the tissues of interest to act as the optimum flip angle.

The step of calculating a relationship between combined SSI MR signal strength of all the tissues of interest and flip angle of the SSI sequence comprises:

respectively calculating a relationship between SSI MR signal strength of each type of tissue of interest for MRI this time and flip angle of the SSI sequence for MRI this time; and according to a principle that combined SSI MR signal strength of all the tissues of interest for MRI this time is equal to an average value of SSI MR signal strength of each type of tissue of interest for MRI this time, acquiring the relationship between combined SSI MR signal strength of all the tissues of interest and flip angle of the SSI sequence.

The step of respectively calculating a relationship between SSI MR signal strength of each type of tissue of interest for MRI this time and flip angle of the SSI sequence for MRI this time comprises:

$$S_i = \rho_{0_i} \cdot \frac{M_{0_i} \cdot \left(1 - e^{-TR/T_{1_i}}\right)}{\left(1 - e^{-TR/T_{1_i}} \cdot \cos\theta\right)} \sin\theta \cdot e^{-TE/T_{2_i}^*}$$

wherein $S_i$ is SSI MR signal strength of the ith type of tissue of interest, $\rho_{0_i}$ is spin density of the ith type of tissue of interest, $M_{0_i}$ is magnetization strength of the ith type of tissue of interest in a state of thermal equilibrium, $T_{1_i}$ is T1 of the ith type of tissue of interest, $T^*_{2_i}$ is T2* of the ith type of tissue of interest, TR is TR of the SSI sequence, TE is TE of the SSI sequence, and θ is the flip angle of the SSI sequence; and the step of acquiring a relationship between combined SSI MR signal strength of all the tissues of interest and flip angle of the SSI sequence comprises:

$$\hat{S} = \frac{1}{N} \cdot \sum_{i=1}^{N} S_i$$

wherein N is the total number of types of tissue of interest for MRI this time, and $\hat{S}$ is combined SSI MR signal strength of all the tissues of interest for MRI this time.

An apparatus for determining a flip angle for multi-tissue magnetic resonance scanning, the apparatus comprising:

a signal strength acquisition module, which is used for determining multiple types of tissue of interest for MRI (magnetic resonance imaging) this time; acquiring a relationship between combined SSI (steady state incoherent) MR (magnetic resonance) signal strength of all the tissues of interest and flip angle of an SSI sequence for MRI this time; according to the relationship between combined SSI MR signal strength of all the tissues of interest and flip angle of the SSI sequence for MRI this time, acquiring a maximum value of the combined SSI MR signal strength of all the tissues of interest; and a flip angle determination module, which is used for, according to the maximum value of the combined SSI MR signal strength of all the tissues of interest, acquiring an optimum flip angle that causes the combined SSI MR signal strength of all the tissues of interest and contrast between the tissues of interest simultaneously to be optimal; and taking the optimum flip angle as a flip angle of an SSI sequence for multi-tissue MR scanning this time.

The step of the signal strength acquisition module acquiring a relationship between combined SSI MR signal strength of all the tissues of interest and flip angle of an SSI sequence for MRI this time comprises:

according to longitudinal relaxation time T1, enhanced transverse relaxation time T2*, magnetization strength in a state of thermal equilibrium and spin density of each type of tissue of interest for MRI this time, and repetition time TR and echo time TE of an SSI sequence for MRI this time, calculating a relationship between combined SSI MR signal strength of all the tissues of interest and flip angle of the SSI sequence.

The step of the flip angle determination module, according to the maximum value of the combined SSI MR signal strength of all the tissues of interest, acquiring an optimum flip angle which causes the combined SSI MR signal strength of all the tissues of interest and contrast between the tissues of interest simultaneously to be optimal comprises:

subtracting a maximum tolerance value from the maximum value of the combined SSI MR signal strength of all the tissues of interest, to obtain a final value of combined SSI MR signal strength of all the tissues of interest; and taking a larger flip angle corresponding to the final value of combined SSI MR signal strength of all the tissues of interest to act as the optimum flip angle.

The step of the signal strength acquisition module calculating a relationship between combined SSI MR signal strength of all the tissues of interest and flip angle of the SSI sequence comprises:

respectively calculating a relationship between SSR MR signal strength of each type of tissue of interest for MRI this time and flip angle of the SSI sequence for MRI this time; according to a principle that combined SSI MR signal strength of all the tissues of interest for MRI this time is equal to an average value of SSI MR signal strength of each type of tissue of interest for MRI this time, acquiring the relationship between combined SSI MR signal strength of all the tissues of interest and flip angle of the SSI sequence.

The step of the signal strength acquisition module respectively calculating a relationship between SSI MR signal strength of each type of tissue of interest for MRI this time and flip angle of the SSI sequence for MRI this time comprises:

$$S_i = \rho_{0_i} \cdot \frac{M_{0_i} \cdot \left(1 - e^{-TR/T_{1_i}}\right)}{\left(1 - e^{-TR/T_{1_i}} \cdot \cos\theta\right)} \sin\theta \cdot e^{-TE/T^*_{2_i}}$$

wherein $S_i$ is SSI MR signal strength of the ith type of tissue of interest, $\rho_{0_i}$ is spin density of the ith type of tissue of interest, $M_{0_i}$ is magnetization strength of the ith type of tissue of interest in a state of thermal equilibrium, $T_{1_i}$ is T1 of the ith type of tissue of interest, $T^*_{2_i}$ is T2* of the ith type of tissue of interest, TR is TR of the SSI sequence, TE is TE of the SSI sequence, and $\theta$ is the flip angle of the SSI sequence; and the step of the signal strength acquisition module acquiring a relationship between combined SSI MR signal strength of all the tissues of interest and flip angle of the SSI sequence comprises:

$$\hat{S} = \frac{1}{N} \cdot \sum_{i=1}^{N} S_i$$

wherein N is the total number of types of tissue of interest for MRI this time, and $\hat{S}$ is combined SSI MR signal strength of all the tissues of interest for MRI this time.

An MRI (magnetic resonance imaging) system, the MRI system comprising the apparatus for determining a flip angle for multi-tissue magnetic resonance scanning of any one of the aspects described above.

In aspects of the present disclosure, before multi-tissue magnetic resonance imaging, by means of acquiring a relationship between combined SSI MR signal strength of all tissues of interest and flip angle for MRI this time, a maximum value of the combined SSI MR signal strength of all the tissues of interest is acquired, and then, according to the maximum value of the combined SSI MR signal strength of all the tissues of interest, an optimum flip angle which causes the combined SSI MR signal strength of all the tissues of interest and contrast between the tissues of interest simultaneously to be optimal is acquired, the optimum flip angle is taken as a flip angle of an SSI sequence for multi-tissue MR scanning this time; thus, a flip angle which enables the signal strength of tissues of interest and contrast between the tissues of interest to be optimal is acquired, before multi-tissue magnetic resonance imaging, thereby enabling multi-tissue magnetic resonance imaging this time to acquire optimal signal strength of tissues of interest and contrast between the tissues of interest.

BRIEF DESCRIPTION OF THE DRAWINGS

Preferred aspects of the present disclosure are described in detail below with reference to the drawings to give those skilled in the art a clearer understanding of the above-mentioned and other features and advantages of the present disclosure. In the figures.

Figure 6:
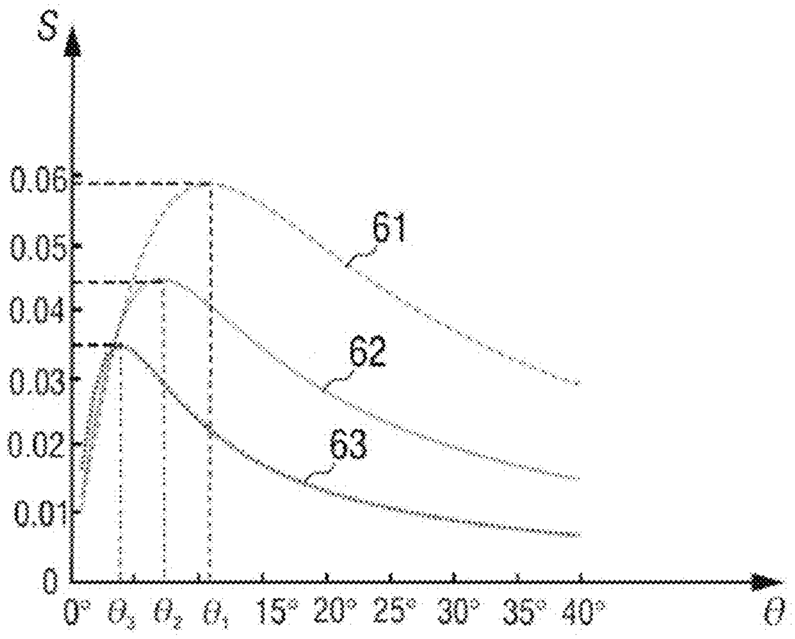
FIG. 6 is a diagram of relationships between SSI MR signal strength of WM, GM and CSF, and flip angle in one brain MRI scan.

The reference labels are as follows:

| Label | Meaning |
|---|---|
| 101-105 | Steps |
| 201-207 | Steps |
| 31 | Curve of SSI MR signal strength of GM changing with flip angle |
| 32 | Curve of SSI MR signal strength of WM changing with flip angle |
| 30 | Partial view of 31 and 32 |
| 51 | Curve of combined SSI MR signal strength of GM and WM changing with flip angle |
| 52 | Curve of contrast between GM and WM changing with flip angle |
| 61 | Curve of SSI MR signal strength of WM changing with flip angle |
| 62 | Curve of SSI MR signal strength of GM changing with flip angle |
| 63 | Curve of SSI MR signal strength of CSF changing with flip angle |
| 71 | Curve of combined SSI MR signal strength of WM, GM and CSF in FIG. 6 changing with flip angle |
| 72 | Curve of contrast between WM, GM and CSF in FIG. 6 changing with flip angle |
| 91 | Curve of combined SSI MR signal strength of WM, GM and CSF changing with flip angle in an application example of the present disclosure |
| 92 | Curve of contrast between WM, GM, and CSF changing with flip angle in an application example of the present disclosure |
| 1000 | Apparatus for determining flip angle for multi-tissue MR scanning |
| 1001 | Signal strength acquisition module |
| 1002 | Flip angle determination module |

DETAILED DESCRIPTION

To clarify the objectives, technical solutions, and advantages of the present disclosure, the present disclosure is explained in further detail below through aspects.

Figure 1:
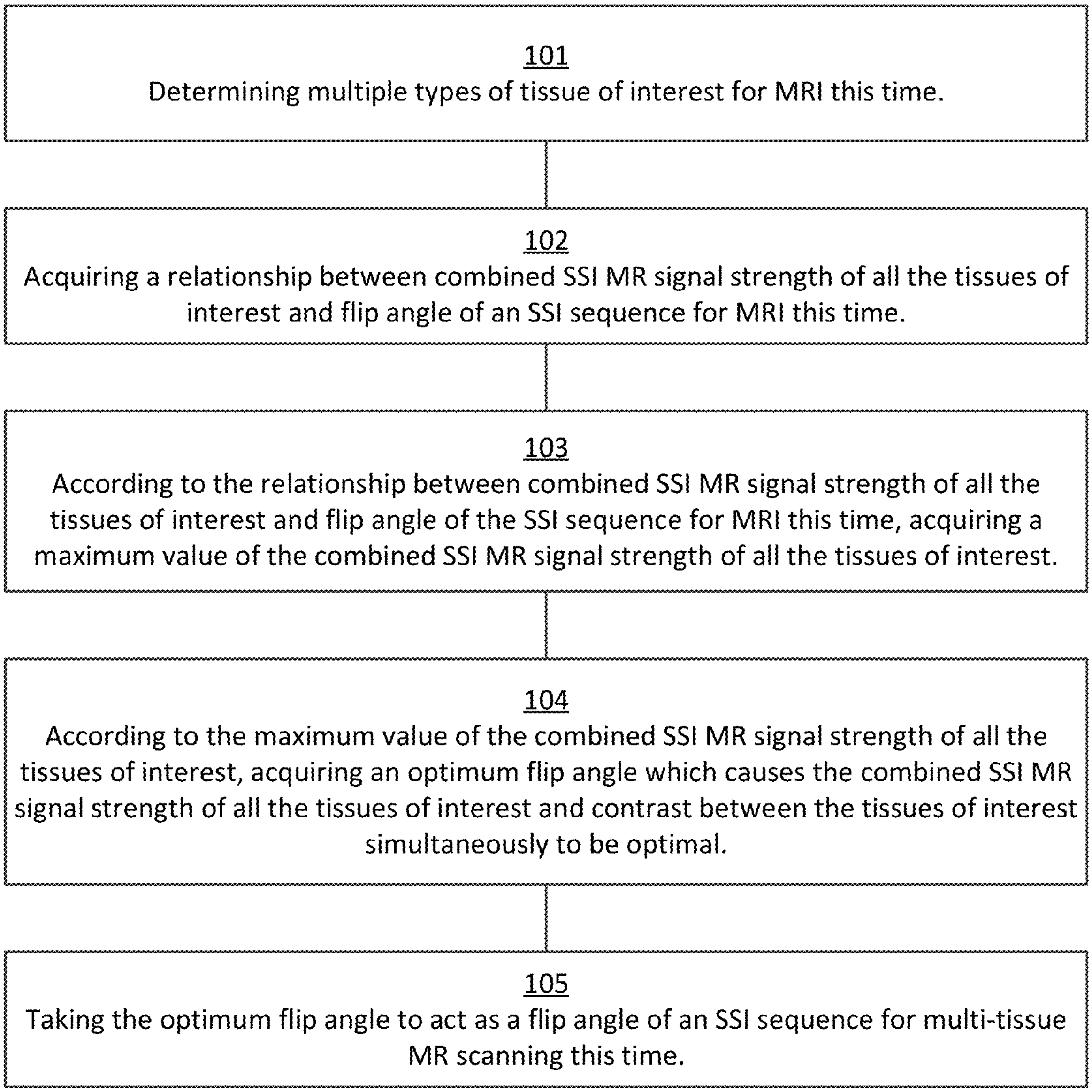
FIG. 1 is a flowchart of a method for determining a flip angle for multi-tissue MR scanning provided by an aspect of the present disclosure.

FIG. 1 is a flowchart of a method for determining a flip angle for multi-tissue MR scanning provided by an aspect of the present disclosure, and the specific steps thereof are as follows:

Step 101: Determining multiple types of tissue of interest for MRI this time.

Step 102: Acquiring a relationship between combined SSI MR signal strength of all the tissues of interest and flip angle of an SSI sequence for MRI this time.

The combined SSI MR signal strength is used for considering in combination SSI MR signal strength of multiple types of tissue of interest for MRI this time, that is, one combined SSI MR signal strength value is used to represent the SSI MR signal strengths of all the tissues of interest for MRI this time.

Step 103: According to the relationship between combined SSI MR signal strength of all the tissues of interest and flip angle of the SSI sequence for MRI this time, acquiring a maximum value of the combined SSI MR signal strength of all the tissues of interest.

Step 104: According to the maximum value of the combined SSI MR signal strength of all the tissues of interest, acquiring an optimum flip angle which causes the combined SSI MR signal strength of all the tissues of interest and contrast between the tissues of interest simultaneously to be optimal.

Step 105: Taking the optimum flip angle to act as a flip angle of an SSI sequence for multi-tissue MR scanning this time.

In the above aspect, before multi-tissue magnetic resonance imaging, by means of acquiring a relationship between combined SSI MR signal strength of all tissues of interest and flip angle for MRI this time, a maximum value of combined SSI MR signal strength of all the tissues of interest is acquired, and then, according to the maximum value of the combined SSI MR signal strength of all the tissues of interest, an optimum flip angle which causes the combined SSI MR signal strength of all the tissues of interest and contrast between the tissues of interest simultaneously to be optimal is acquired, the optimum flip angle is taken as a flip angle of an SSI sequence for multi-tissue MR scanning this time; thus, a flip angle which enables the signal strength of tissues of interest and contrast between the tissues of interest to be optimal is acquired before multi-tissue magnetic resonance imaging, thereby enabling multi-tissue magnetic resonance imaging this time to acquire an optimal signal strength of tissues of interest and contrast between the tissues of interest.

In an optional aspect, in step 102, the step, of acquiring a relationship between combined SSI MR signal strength of all the tissues of interest and flip angle of the SSI sequence for MRI this time, comprises:

according to T1 (longitudinal relaxation time), T2* (enhanced transverse relaxation time), magnetization strength in a state of thermal equilibrium and spin density of each type of tissue of interest for MRI this time, and a set TR (repetition time) and TE (echo time) of an SSI sequence for MRI this time, calculating a relationship between combined SSI MR signal strength of all the tissues of interest and an FA (flip angle) of the SSI sequence.

In an optional aspect, calculating a relationship between combined SSI MR signal strength of all tissues of interest and flip angle of an SSI sequence comprises:

respectively calculating a relationship between SSI MR signal strength of each type of tissue of interest for MRI this time and flip angle of the SSI sequence for MRI this time; according to a principle that combined SSI MR signal strength of all the tissues of interest for MRI this time is equal to an average value of SSI MR signal strength of each type of tissue of interest for MRI this time, acquiring the relationship between combined SSI MR signal strength of all the tissues of interest and flip angle of the SSI sequence.

In an optional aspect, respectively calculating a relationship between SSI MR signal strength of each type of tissue of interest for MRI this time and flip angle of an SSI sequence for MRI this time this comprises:

$$S_i = \rho_{0_i} \cdot \frac{M_{0_i} \cdot \left(1 - e^{-TR/T_{1_i}}\right)}{\left(1 - e^{-TR/T_{1_i}} \cdot \cos\theta\right)} \sin\theta \cdot e^{-TE/T^*_{2_i}} \quad (1)$$

wherein $S_i$ is SSI MR signal strength of the ith type of tissue of interest, $\rho_{0_i}$ is spin density of the ith type of tissue of interest, $M_{0_i}$ is magnetization strength of the ith type of tissue of interest in a state of thermal equilibrium, $T_{1_i}$ is T1 of the ith type of tissue of interest, $T^*_{2_i}$ is T2* of the ith type of tissue of interest, TR is TR of the SSI sequence, TE is TE of the SSI sequence, and θ is the flip angle of the SSI sequence; and and acquiring the relationship between combined SSI MR signal strength of all the tissues of interest and flip angle of the SSI sequence comprises:

$$\hat{S} = \frac{1}{N} \cdot \sum_{i=1}^{N} S_i \quad (2)$$

wherein N is the total number of types of tissue of interest for MRI this time, and $\hat{S}$ is combined SSI MR signal strength of all the tissues of interest for MRI this time.

In an optional aspect, in step 104, the step of acquiring an optimum flip angle which causes the combined SSI MR signal strength of all the tissues of interest and contrast between the tissues of interest simultaneously to be optimal, according to the maximum value of the combined SSI MR signal strength of all the tissues of interest, comprises:

subtracting a maximum tolerance value from the maximum value of combined SSI MR signal strength of all the tissues of interest, to obtain a final value of combined SSI MR signal strength of all the tissues of interest; and taking a larger flip angle corresponding to the final value of combined SSI MR signal strength of all the tissues of interest to act as the optimum flip angle, wherein the maximum tolerance value may be obtained according to experience or multiple experiments.

Figure 2:
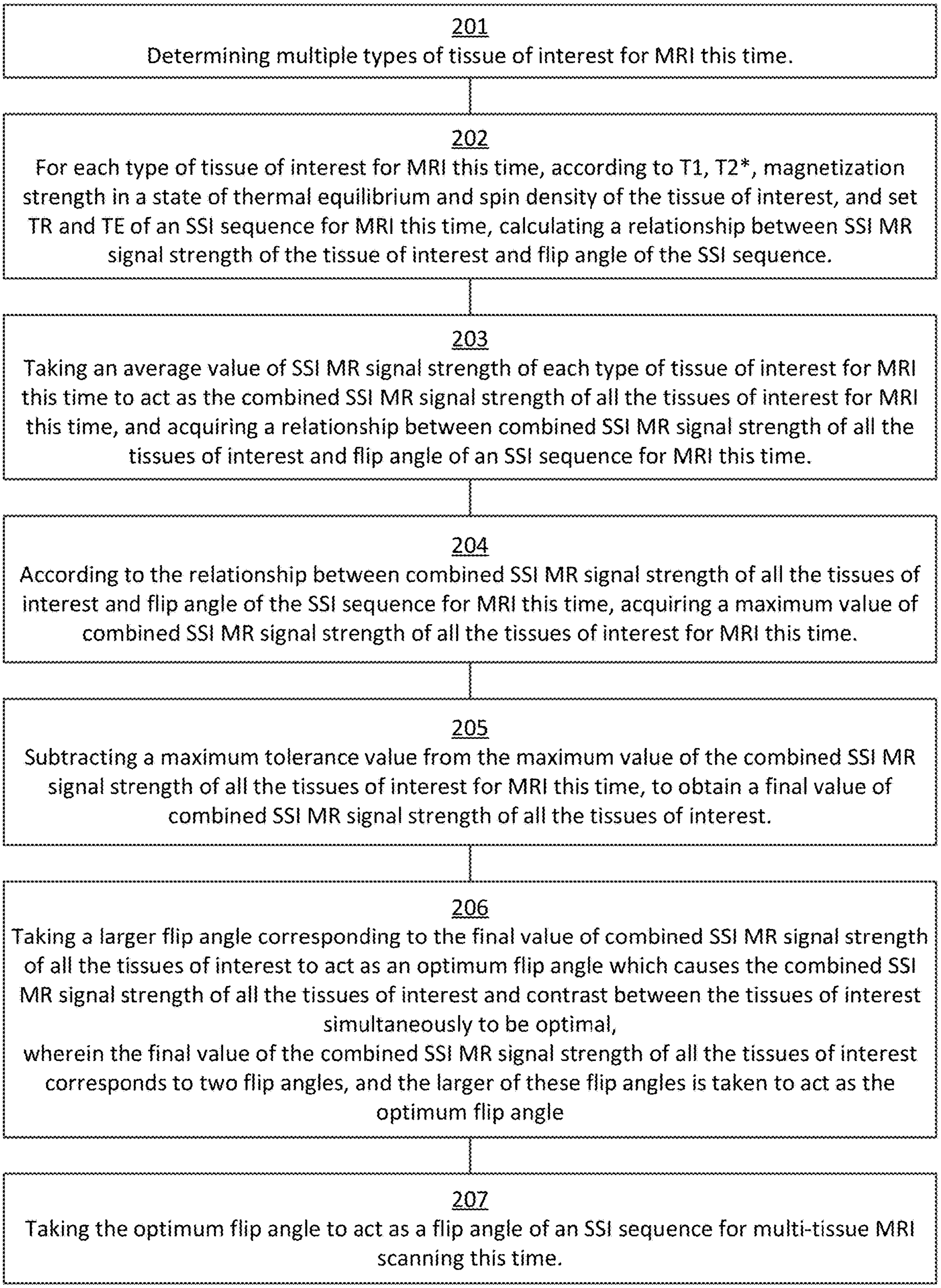
FIG. 2 is a flowchart of a method for determining a flip angle for multi-tissue MR scanning provided by another aspect of the present disclosure.

FIG. 2 is a method for determining a flip angle for multi-tissue MR scanning provided by another aspect of the present disclosure, the specific steps thereof being as follows:

Step 201: Determining multiple types of tissue of interest for MRI this time.

For example: for brain imaging, tissues of interest generally comprise: GM (gray matter), WM (white matter), and CSF (cerebrospinal fluid); for knee joint imaging, tissues of interest generally comprise: muscle, articular cartilage, and synovial fluid.

Step 202: For each type of tissue of interest for MRI this time, according to T1, T2*, magnetization strength in a state of thermal equilibrium and spin density of the tissue of interest, and set TR and TE of an SSI sequence for MRI this time, calculating a relationship between SSI MR signal strength of the tissue of interest and flip angle of the SSI sequence.

For example, for tissue of interest i, the relationship between SSI MR signal strength $S_i$ of the tissue of interest and flip angle $\vartheta$ of an SSI sequence is shown in formula (1).

Figure 3:
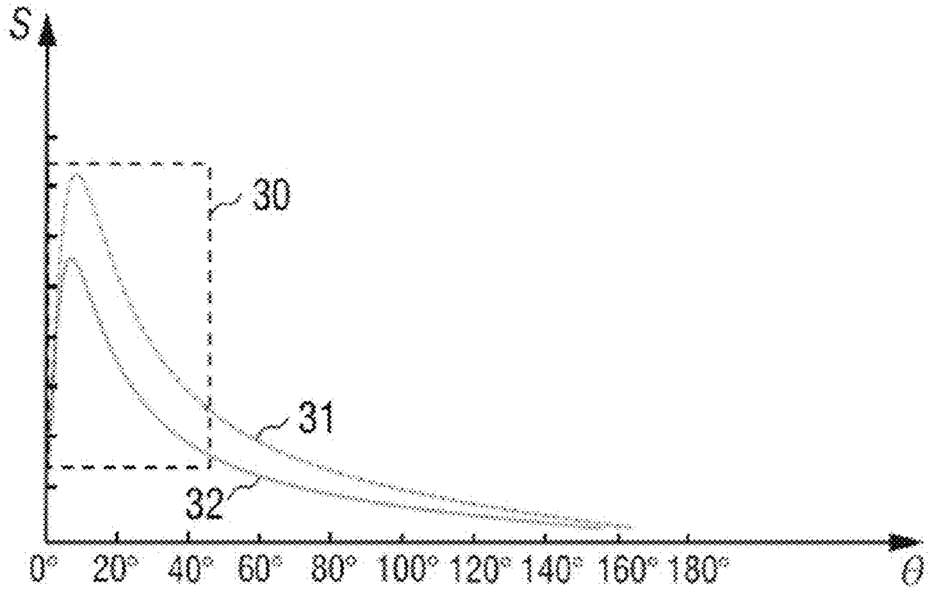
FIG. 3 is a schematic diagram of relationships between SSI MR signal strength of GM and WM tissues of interest and flip angle during brain MRI.
Figure 4:
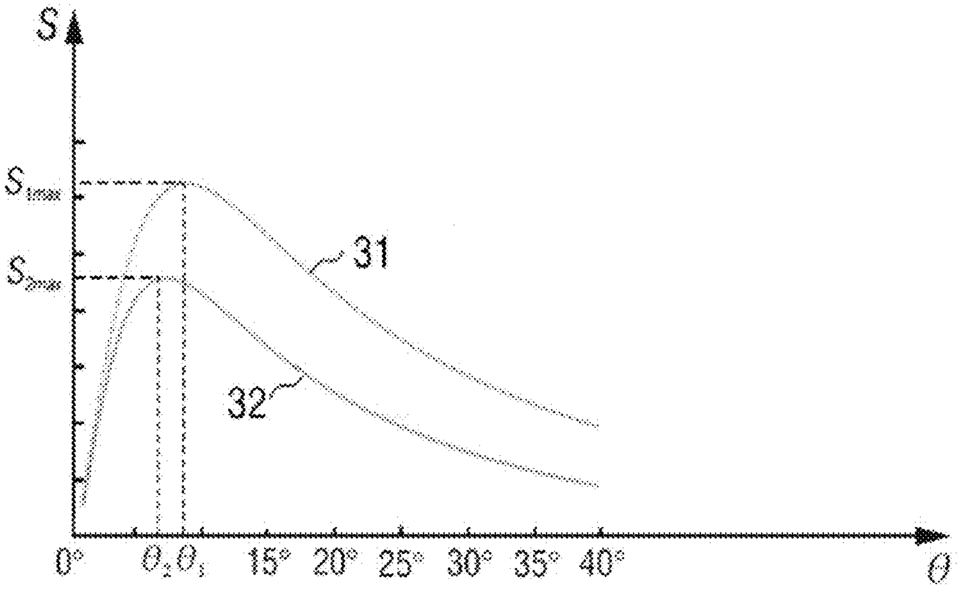
FIG. 4 is an enlarged drawing of 30 in FIG. 3.

FIG. 3 is a schematic diagram of relationships between SSI MR signal strength S of GM and WM tissues of interest and flip angle $\vartheta$, during brain MRI, wherein the horizontal coordinates are flip angle $\vartheta$ and the vertical coordinates are SSI MR signal strength S, curve 31 corresponds to GM and curve 32 corresponds to WM, and FIG. 4 is an enlarged drawing of 30 in FIG. 3, wherein TE=4.7 ms, TR=11 ms, for GM: $T_1$=950 ms, $T^*_2$=100 ms, $M_0$=1, $\rho_0$=0.8; for WM: $T_1$=600 ms, $T^*_2$=80 ms, $M_0$=1, $\rho_0$=0.65; and $\vartheta$ varies from 0° to 180°.

It can be seen from FIGS. 3 and 4 that when $\vartheta=\vartheta_1$, SSI MR signal strength of GM reaches a maximum value $S_{1max}$; and when $\vartheta=\vartheta_2$, SSI MR signal strength of WM reaches a maximum value $S_{2max}$.

For different tissues, $\rho_0$, $T_1$, and $T^*_2$ are different, and when field strength is fixed, $\rho_0$, $T_1$, and $T^*_2$ are known; Table 1 shows $\rho_0$, $T_1$, and $T_2$ values of CSF, WM, GM, and fat when field strength is 1.5 T (teslas), wherein in actual applications, generally $T^*_2=T_2$ is set:

TABLE 1

| Tissue | $\rho_0$ | $T_1$ (ms) | $T_2$ (ms) |
|---|---|---|---|
| CSF | 1 | 4500 | 2200 |
| WM | 0.65 | 600 | 80 |
| GM | 0.8 | 950 | 100 |
| Fat | 0.9 | 250 | 60 |

Step 203: Taking an average value of SSI MR signal strength of each type of tissue of interest for MRI this time to act as the combined SSI MR signal strength of all the tissues of interest for MRI this time, and acquiring a relationship between combined SSI MR signal strength of all the tissues of interest and flip angle of an SSI sequence for MRI this time.

For example: a relationship between combined SSI MR signal strength of all tissues of interest and flip angle of an SSI sequence for MRI this time is shown in formula (2).

Step 204: According to the relationship between combined SSI MR signal strength of all the tissues of interest and flip angle of the SSI sequence for MRI this time, acquiring a maximum value of combined SSI MR signal strength of all the tissues of interest for MRI this time.

Step 205: Subtracting a maximum tolerance value from the maximum value of the combined SSI MR signal strength of all the tissues of interest for MRI this time to obtain a final value of combined SSI MR signal strength of all the tissues of interest.

Step 206: Taking a larger flip angle corresponding to the final value of combined SSI MR signal strength of all the tissues of interest to act as an optimum flip angle, which causes the combined SSI MR signal strength of all the tissues of interest and contrast between the tissues of interest simultaneously to be optimal, wherein the final value of the combined SSI MR signal strength of all the tissues of interest corresponds to two flip angles, and the larger of these flip angles is taken to act as the optimum flip angle.

Figure 5:
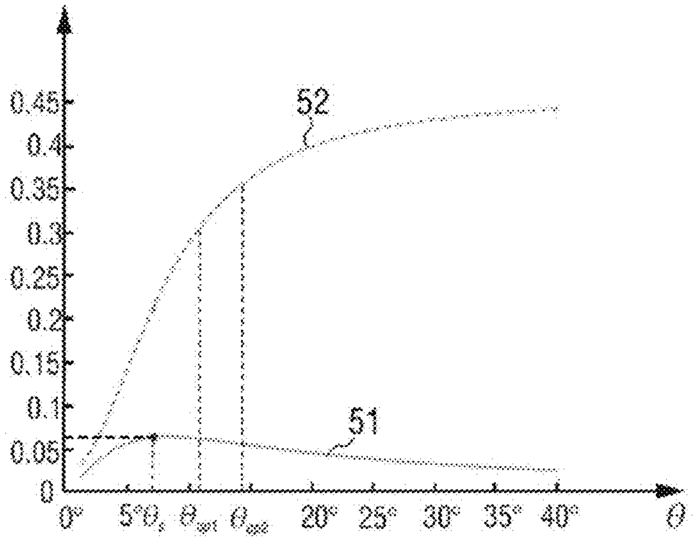
FIG. 5 is a diagram showing how combined SSI MR signal strength of GM and WM, and contrast between GM and WM, are related to flip angle when tissues of interest are GM and WM

FIG. 5 is a diagram showing how combined SSI MR signal strength $\hat{S}$ of GM and WM, and contrast $\hat{C}$ between GM and WM, are related to flip angle $\vartheta$, when tissues of interest are GM and WM, wherein:

$$\hat{S} = \frac{S_1 + S_2}{2},\ \hat{C} = \frac{|(S_1 - S_2)|}{\hat{S}}$$

wherein $S_1$ is SSI MR signal strength of GM, and $S_2$ is SSI MR signal strength of WM.

In FIG. 5, curve 51 corresponds to $\hat{S}$, and curve 52 corresponds to $\hat{C}$.

It can be seen from FIG. 5 that $\hat{S}$ first rises and then lowers as $\vartheta$ rises, wherein when $\vartheta=\vartheta_s$, $\hat{S}$ reaches a maximum value, and $\hat{C}$ continuously rises as $\vartheta$ rises. Therefore, to cause $\hat{S}$ and $\hat{C}$ simultaneously to be optimal, it is necessary for $\hat{S}$ and $\hat{C}$ to simultaneously make some sacrifices, and, according to a tolerance range of $\hat{S}$, the larger angle $\vartheta$ corresponding to a value obtained after subtracting a maximum tolerance value from $\hat{S}$ is taken to act as an optimum flip angle. For example: in FIG. 5, $\vartheta_{op1}$ is the optimum flip angle corresponding to when the maximum tolerance value is a first value, and $\vartheta_{op2}$ is the optimum flip angle corresponding to when the maximum tolerance value is a second value.

Step 207: Taking the optimum flip angle to act as a flip angle of an SSI sequence for multi-tissue MRI scanning this time.

FIG. 6 is a diagram of relationships between SSI MR signal strength S of 3 tissues of interest, i.e., WM, GM and CSF, and flip angle $\vartheta$, for one brain MRI scan, curves 61, 62 and 63 respectively corresponding to WM, GM and CSF, wherein $\vartheta$ corresponding to the maximum SSI MR signal strength of WM, GM and CSF respectively is $\vartheta_1$, $\vartheta_2$ and $\vartheta_3$.

Figure 7:
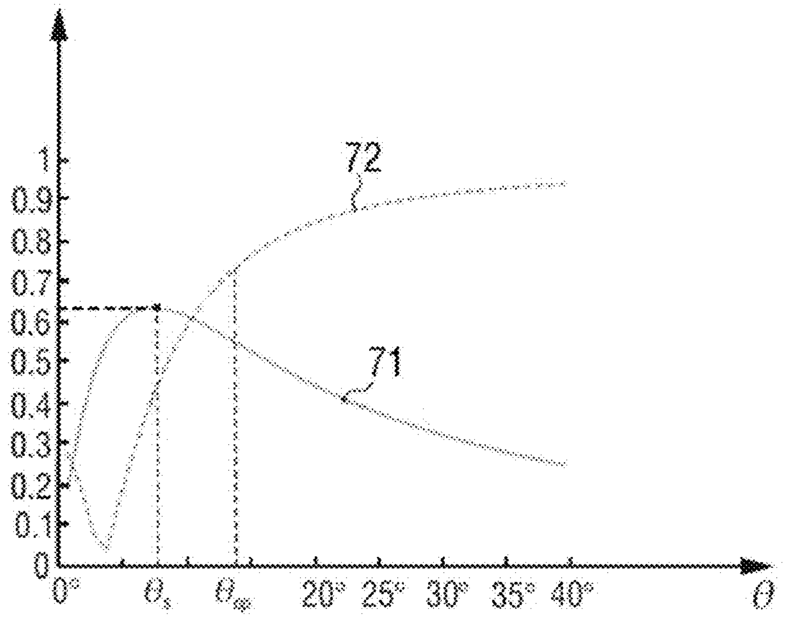
FIG. 7 is a diagram showing how combined SSI MR signal strength of the 3 tissues of interest in FIG. 6, and contrast between the 3 tissues of interest are related to flip angle.

FIG. 7 is a diagram showing how combined SSI MR signal strength $\hat{S}$ of the 3 tissues of interest in FIG. 6, and contrast $\hat{C}$ between the 3 tissues of interest, are related to flip angle $\vartheta$, wherein $$\hat{S} = \frac{S_1 + S_2 + S_3}{3} = \frac{S_1(\theta) + S_2(\theta) + S_3(\theta)}{3},$$

$$\hat{C} = \frac{|S_2 - S_1|}{|S_2 + S_1|} + \frac{|S_3 - S_2|}{|S_3 + S_2|} = \frac{|S_2(\theta) - S_1(\theta)|}{|S_2(\theta) + S_1(\theta)|} + \frac{|S_3(\theta) - S_2(\theta)|}{|S_3(\theta) + S_2(\theta)|},$$

and $S_1/S_1(\vartheta)$, $S_2/S_2(\vartheta)$ and $S_3/S_3(\vartheta)$ respectively correspond to SSI MR signal strength of WM, GM and CSF, and in FIG. 7, curve 71 corresponds to $\hat{S}$, curve 72 corresponds to $\hat{C}$, $\vartheta_s$ is the $\vartheta$ corresponding to the maximum value of combined SSI MR signal strength of the 3 tissues of interest, and $\vartheta_{op}$ is the optimum flip angle.

Application examples of the present disclosure are given below:

A volunteer on a 1.5 T MRI system equipped with a 16-channel head/neck coil is experimented on, and receives a head MRI. An SSI sequence used is a 3D GRE (gradient recalled echo) sequence. Imaging parameters are as follows: FOV (field of view)=230 mm×200 mm, TE=2.77 ms, TR=2.77/6.5 ms, basic resolution=256, phase resolution=80%, layer/block=52, and bandwidth/pixel=300 Hz. Tissues of interest are: GW, WM and CSF.

Figure 8:
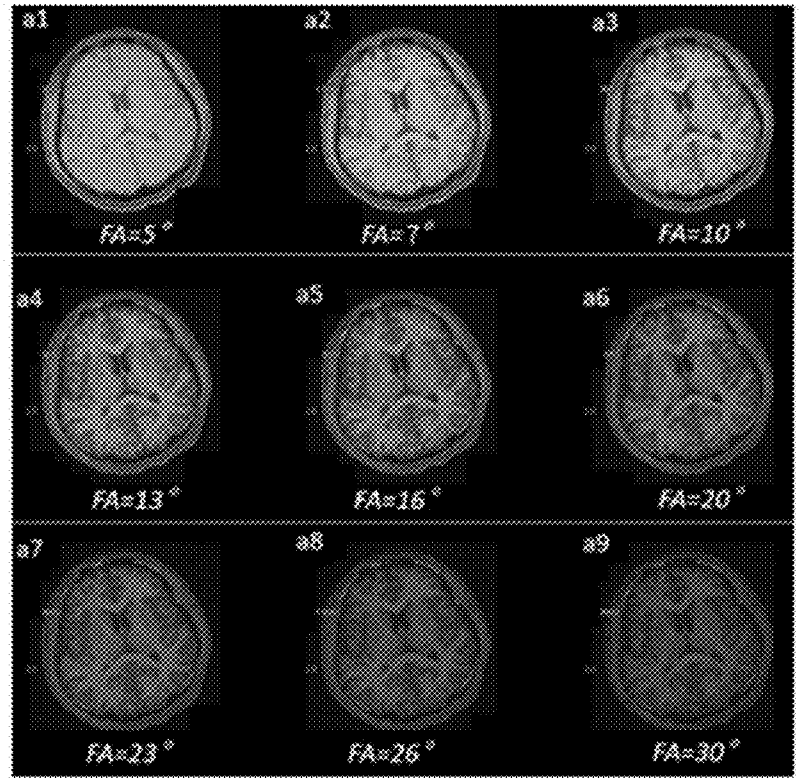
FIG. 8 is brain imaging pictures at different flip angles in an application example of the present disclosure.

FIG. 8 is brain imaging pictures at different flip angles $\vartheta$, wherein flip angles corresponding to a1-a9 are respectively: 5°, 7°, 10°, 13°, 16°, 20°, 23°, 26°, and 30°, and, it can be seen by observation that: in picture a4, that is when $\vartheta$=13°, signal strength of tissues of interest and contrast between the tissues of interest is optimal.

Figure 9:
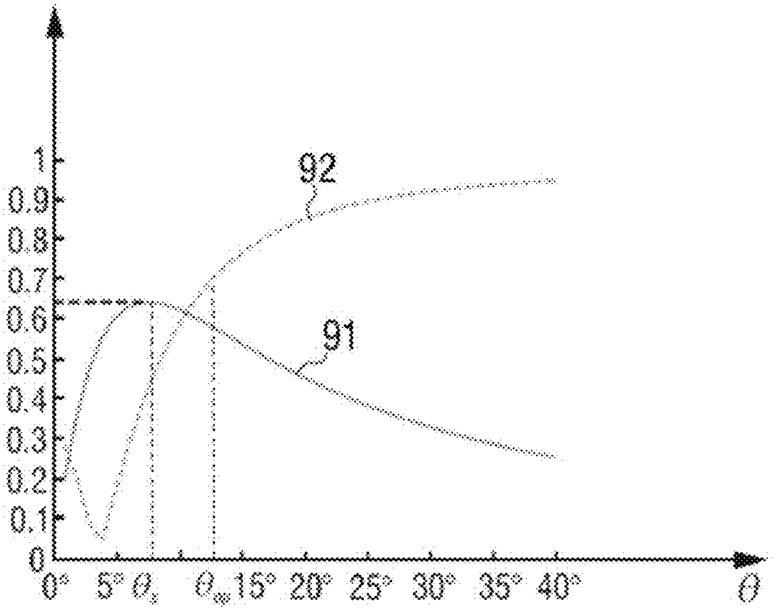
FIG. 9 is a diagram showing how combined SSI MR signal strength of 3 tissues of interest, i.e., GM, WM and CSF, and contrast between the 3 tissues of interest, are related to flip angle when a method provided by an aspect of the present disclosure is used to calculate an optimum flip angle of an application example of the present disclosure.

FIG. 9 is a diagram showing how combined SSI MR signal strength $\hat{S}$ of 3 tissues of interest, i.e. GM, WM and CSF, and contrast $\hat{C}$ between the 3 tissues of interest, are related to flip angle $\vartheta$, when a method provided by an aspect of the present disclosure is used to calculate the optimum flip angle of this application example of the present disclosure, wherein curve 91 corresponds to $\hat{S}$, and curve 92 corresponds to $\hat{C}$. The maximum tolerance percentage is set at 10%, and calculated results are: when $\vartheta_s$=8°, $\hat{S}$ is the maximum, being $\hat{S}_{max}$, then the larger $\vartheta$ corresponding to $\hat{S}_{max}(1-10\%)=0.9\hat{S}_{max}$ is the optimum flip angle $\vartheta_{op}$, and, it can be seen from FIG. 9 that the optimum angle $\vartheta_{op}$=13°. It can be seen that the optimum flip angle calculated by means of the method provided by an aspect of the present disclosure is the same as the optimum flip angle obtained by experimental results.

In an actual application, when the tissue of interest changes, or imaging parameters of an SSI sequence (such as TE and/or TR, or what may result in TE and/or TR changing: FOV and/or resolution and/or voxel size and/or bandwidth/pixel, etc.) change, the method provided by an aspect of the present disclosure may be used to calculate an optimum flip angle of the SSI sequence, and then this optimum flip angle is used for MR scanning.

Figure 10:
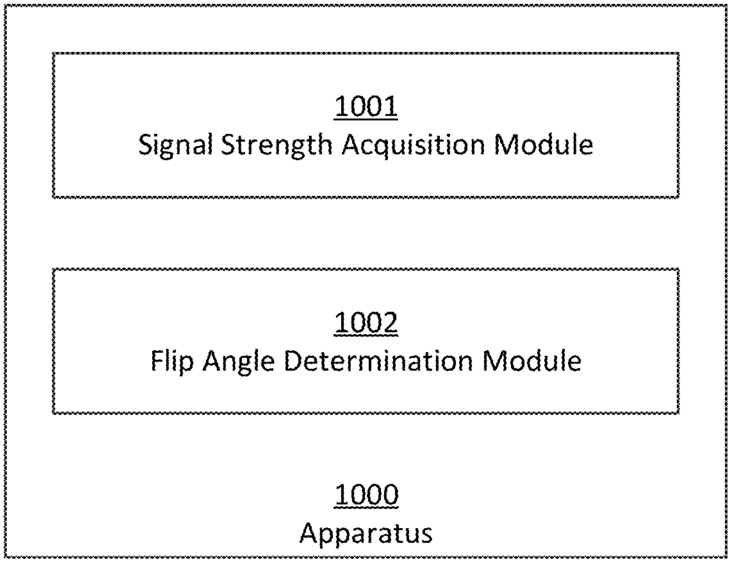
FIG. 10 is a schematic structural diagram of an apparatus for determining a flip angle for multi-tissue MR scanning provided by an aspect of the present disclosure.

FIG. 10 is a schematic structural diagram of an apparatus 1000 for determining a flip angle for multi-tissue MR scanning provided by an aspect of the present disclosure. The apparatus mainly comprises: a signal strength acquisition module 1001 and a flip angle determination module 1002, wherein:

The signal strength acquisition module 1001 is used for determining multiple types of tissue of interest for MRI this time; acquiring a relationship between combined SSI MR signal strength of all the tissues of interest and flip angle of an SSI sequence for MRI this time; according to the relationship between combined SSI MR signal strength of all the tissues of interest and flip angle of the SSI sequence for MRI this time, acquiring a maximum value of the combined SSI MR signal strength of all the tissues of interest.

The flip angle determination module 1002 is used for, according to the maximum value of the combined SSI MR signal strength of all the tissues of interest acquired by the signal strength acquisition module 1001, acquiring an optimum flip angle that causes the combined SSI MR signal strength of all the tissues of interest and contrast between the tissues of interest simultaneously to be optimal; and taking the optimum flip angle to act as a flip angle of an SSI sequence for multi-tissue MR scanning this time.

In an optional aspect, the step of the signal strength acquisition module 1001 acquiring a relationship between combined SSI MR signal strength of all the tissues of interest and flip angle of an SSI sequence for MRI this time comprises:

according to T1, T2*, magnetization strength in a state of thermal equilibrium and spin density of each type of tissue of interest for MRI this time, and TR and TE of an SSI sequence for MRI this time, calculating a relationship between combined SSI MR signal strength of all the tissues of interest and flip angle of the SSI sequence.

In an optional aspect, the step of the flip angle determination module 1002, according to the maximum value of the combined SSI MR signal strength of all the tissues of interest, acquiring an optimum flip angle which causes the combined SSI MR signal strength of all the tissues of interest and contrast between the tissues of interest simultaneously to be optimal comprises:

subtracting a maximum tolerance value from the maximum value of combined SSI MR signal strength of all the tissues of interest, to obtain a final value of combined SSI MR signal strength of all the tissues of interest; and taking a larger flip angle corresponding to the final value of combined SSI MR signal strength of all the tissues of interest to act as the optimum flip angle.

In an optional aspect, the step of the signal strength acquisition module 1001 calculating a relationship between combined SSI MR signal strength of all the tissues of interest and flip angle of an SSI sequence comprises:

respectively calculating a relationship between SSR MR signal strength of each type of tissue of interest for MRI this time and flip angle of the SSI sequence for MRI this time; according to a principle that combined SSI MR signal strength of all the tissues of interest for MRI this time is equal to an average value of SSI MR signal strength of each type of tissue of interest for MRI this time, acquiring the relationship between combined SSI MR signal strength of all the tissues of interest and flip angle of the SSI sequence.

In an optional aspect, the step of the signal strength acquisition module 1001 respectively calculating a relationship between SSR MR signal strength of each type of tissue of interest for MRI this time and flip angle of an SSI sequence for MRI this time comprises:

$$S_i = \rho_{0_i} \cdot \frac{M_{0_i} \cdot \left(1 - e^{-TR/T1_i}\right)}{\left(1 - e^{-TR/T1_i} \cdot \cos\theta\right)} \sin\theta \cdot e^{-TE/T_{2_i}^*}$$

wherein $S_i$ is SSI MR signal strength of the ith type of tissue of interest, $\rho_{0_i}$ is spin density of the ith type of tissue of interest, $M_{0_i}$ is magnetization strength of the ith type of tissue of interest in a state of thermal equilibrium, $T_{1_i}$ is T1 of the ith type of tissue of interest, $T^*_{2_i}$ is T2* of the ith type of tissue of interest, TR is TR of the SSI sequence, TE is TE of the SSI sequence, and θ is the flip angle of the SSI sequence; and The step of the signal strength acquisition module 1001 acquiring a relationship between combined SSI MR signal strength of all the tissues of interest and flip angle of the SSI sequence comprises:

$$\hat{S} = \frac{1}{N} \cdot \sum_{i=1}^{N} S_i$$

wherein N is the total number of types of tissue of interest for MRI this time, and $\hat{S}$ is combined SSI MR signal strength of all the tissues of interest for MRI this time.

An aspect of the present disclosure further provides an MRI system comprising the apparatus 1000 for determining a flip angle for multi-tissue magnetic resonance scanning provided by an aspect of the present disclosure.

The above-described aspects are only preferred aspects of the present disclosure rather than being intended to limit the scope of the present disclosure, and any modifications, equivalent substitutions, improvements, etc., made without departing from the spirit and principle of the present disclosure shall all fall within the scope of protection of the present disclosure.

The invention claimed is:

1. A method for determining a flip angle for multi-tissue magnetic resonance scanning, comprising:

determining, by a signal strength acquisition module, multiple types of tissue of interest for MRI (magnetic resonance imaging);

acquiring, by the signal strength acquisition module, a relationship between combined SSI MR (steady state incoherent magnetic resonance) signal strength of all the tissues of interest and flip angle of an SSI sequence for MRI;

according to the relationship between combined SSI MR signal strength of all the tissues of interest and flip angle of the SSI sequence for MRI, acquiring, by the signal strength acquisition module, a maximum value of the combined SSI MR signal strength of all the tissues of interest;

according to the maximum value of the combined SSI MR signal strength of all the tissues of interest, acquiring, by a flip angle determination module, an optimum flip angle which causes the combined SSI MR signal strength of all the tissues of interest and contrast between the tissues of interest simultaneously to be optimal;

taking, by the flip angle determination module, the optimum flip angle as a flip angle of an SSI sequence for multi-tissue MR scanning; and performing multi-tissue MR scanning using the SSI sequence at the optimum flip angle.

2. The method as claimed in claim 1, wherein the step of acquiring the relationship between combined SSI MR signal strength of all the tissues of interest and flip angle of an SSI sequence for MRI comprises:

according to longitudinal relaxation time T1, enhanced transverse relaxation time T2*, a magnetization strength in a state of thermal equilibrium and a spin density of each type of tissue of interest for MRI, and repetition time TR and echo time TE of an SSI sequence for MRI, calculating the relationship between combined SSI MR signal strength of all the tissues of interest and flip angle of the SSI sequence.

3. The method as claimed in claim 2, wherein the step of calculating the relationship between combined SSI MR signal strength of all the tissues of interest and flip angle of the SSI sequence comprises:

respectively calculating a relationship between SSI MR signal strength of each type of tissue of interest for MRI and flip angle of the SSI sequence for MRI; and according to a principle that combined SSI MR signal strength of all the tissues of interest for MRI is equal to an average value of SSI MR signal strength of each type of tissue of interest for MRI, acquiring the relationship between combined SSI MR signal strength of all the tissues of interest and flip angle of the SSI sequence.

4. The method as claimed in claim 3, wherein the step of respectively calculating the relationship between SSI MR signal strength of each type of tissue of interest for MRI and flip angle of the SSI sequence for MRI comprises:

$$S_i = \rho_{0_i} \cdot \frac{M_{0_i} \cdot \left(1 - e^{-\frac{TR}{T_{1_i}}}\right)}{\left(1 - e^{-\frac{TR}{T_{1_i}}} \cdot \cos\theta\right)} \sin\theta \cdot e^{-TE/T_{2_i}^*},$$

wherein $S_i$ is SSI MR signal strength of an ith type of tissue of interest, $\pi_{0_i}$ is spin density of the ith type of tissue of interest, $M_{0_i}$ is magnetization strength of the ith type of tissue of interest in a state of thermal equilibrium, $T_{1_i}$ is T1 of the ith type of tissue of interest, $T^*_{2_i}$ is T2* of the ith type of tissue of interest, TR is the repetition time of the SSI sequence, TE is the echo time of the SSI sequence, and θ is the flip angle of the SSI sequence; and the step of acquiring the relationship between the combined SSI MR signal strength of all the tissues of interest and flip angle of the SSI sequence comprises:

$$\hat{S} = \frac{1}{N} \cdot \sum_{i=1}^{N} S_i,$$

wherein N is a total number of types of tissue of interest for MRI, and $\hat{S}$ is combined SSI MR signal strength of all the tissues of interest for MRI.

5. The method as claimed in claim 1, wherein the step of acquiring the optimum flip angle which causes the combined SSI MR signal strength of all the tissues of interest and the contrast between the tissues of interest simultaneously to be optimal, according to the maximum value of the combined SSI MR signal strength of all the tissues of interest, comprises:

subtracting a maximum tolerance value from the maximum value of the combined SSI MR signal strength of all the tissues of interest, to obtain a final value of combined SSI MR signal strength of all the tissues of interest; and taking a larger flip angle corresponding to the final value of combined SSI MR signal strength of all the tissues of interest to act as the optimum flip angle.

6. An apparatus for determining a flip angle for multi-tissue magnetic resonance scanning, comprising:

a signal strength acquisition module operable to determine multiple types of tissue of interest for MRI (magnetic resonance imaging); acquire a relationship between combined SSI (steady state incoherent) MR (magnetic resonance) signal strength of all the tissues of interest and flip angle of an SSI sequence for MRI; and according to a relationship between the combined SSI MR signal strength of all the tissues of interest and flip angle of the SSI sequence for MRI, acquire a maximum value of the combined SSI MR signal strength of all the tissues of interest;

a flip angle determination module operable to, according to a maximum value of the combined SSI MR signal strength of all the tissues of interest, acquire an optimum flip angle which causes the combined SSI MR signal strength of all the tissues of interest and contrast between the tissues of interest simultaneously to be optimal; and take the optimum flip angle as a flip angle of an SSI sequence for multi-tissue MR scanning; and an MRI scanner configured to perform multi-tissue MR scanning using the SSI sequence at the optimum flip angle.

7. The apparatus as claimed in claim 6, wherein the acquisition by the signal strength acquisition module of the relationship between combined SSI MR signal strength of all the tissues of interest and flip angle of the SSI sequence for MRI comprises:

according to longitudinal relaxation time T1, enhanced transverse relaxation time T2*, magnetization strength in a state of thermal equilibrium and a spin density of each type of tissue of interest for MRI, and repetition time TR and echo time TE of an SSI sequence for MRI, calculating the relationship between combined SSI MR signal strength of all the tissues of interest and flip angle of the SSI sequence.

8. The apparatus as claimed in claim 7, wherein the calculation by the signal strength acquisition module of the relationship between combined SSI MR signal strength of all the tissues of interest and flip angle of the SSI sequence comprises:

respectively calculating a relationship between SSR MR signal strength of each type of tissue of interest for MRI and flip angle of the SSI sequence for MRI; and according to a principle that combined SSI MR signal strength of all the tissues of interest for MRI is equal to an average value of SSI MR signal strength of each type of tissue of interest for MRI, acquiring the relationship between combined SSI MR signal strength of all the tissues of interest and flip angle of the SSI sequence.

9. The apparatus as claimed in claim 8, wherein the calculation by the signal strength acquisition module respectively of the relationship between SSI MR signal strength of each type of tissue of interest for MRI and flip angle of the SSI sequence for MRI comprises:

$$S_i = \rho_{0_i} \cdot \frac{M_{0_i} \cdot \left(1 - e^{-\frac{TR}{T_{1_i}}}\right)}{\left(1 - e^{-\frac{TR}{T_{1_i}}} \cdot \cos\theta\right)} \sin\theta \cdot e^{-TE/T_{2_i}^*},$$

wherein $S_i$ is SSI MR signal strength of an ith type of tissue of interest, $\pi_{0_i}$ is spin density of the ith type of tissue of interest, $M_{0_i}$ is magnetization strength of the ith type of tissue of interest in a state of thermal equilibrium, $T_{1_i}$ is T1 of the ith type of tissue of interest, $T_{2_i}*$ is T2* of the ith type of tissue of interest, TR is the repetition time of the SSI sequence, TE is the echo time of the SSI sequence, and θ is the flip angle of the SSI sequence; and the acquisition by the signal strength acquisition module of the relationship between combined SSI MR signal strength of all the tissues of interest and flip angle of the SSI sequence comprises:

$$\hat{S} = \frac{1}{N} \cdot \sum_{i=1}^{N} S_i,$$

wherein N is a total number of types of tissue of interest for MRI, and $\hat{S}$ is combined SSI MR signal strength of all the tissues of interest for MRI.

10. The apparatus as claimed in claim 6, wherein the acquisition by the flip angle determination module, according to the maximum value of the combined SSI MR signal strength of all the tissues of interest, of the optimum flip angle which causes the combined SSI MR signal strength of all the tissues of interest and the contrast between the tissues of interest simultaneously to be optimal comprises:

subtracting a maximum tolerance value from the maximum value of the combined SSI MR signal strength of all the tissues of interest, to obtain a final value of combined SSI MR signal strength of all the tissues of interest; and taking a larger flip angle corresponding to the final value of combined SSI MR signal strength of all the tissues of interest to act as the optimum flip angle.

11. An MRI (magnetic resonance imaging) system, wherein the MRI system comprises the apparatus for determining the flip angle for multi-tissue magnetic resonance scanning as claimed in claim 6.

* * * * *